US009124237B2

(12) United States Patent
Sasaki

(10) Patent No.: US 9,124,237 B2
(45) Date of Patent: Sep. 1, 2015

(54) ELECTRONIC COMPONENT

(71) Applicant: Murata Manufacturing Co., Ltd., Nagaokakyo-shi, Kyoto-fu (JP)

(72) Inventor: Hiroyuki Sasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 240 days.

(21) Appl. No.: 13/893,562

(22) Filed: May 14, 2013

(65) Prior Publication Data

US 2013/0314176 A1 Nov. 28, 2013

(30) Foreign Application Priority Data

May 28, 2012 (JP) ................................ 2012-121169

(51) Int. Cl.
  *H03H 7/01* (2006.01)
  *H03H 9/05* (2006.01)
  *H03H 1/00* (2006.01)

(52) U.S. Cl.
  CPC ........... *H03H 7/0161* (2013.01); *H03H 7/0115* (2013.01); *H03H 7/1708* (2013.01); *H03H 7/1775* (2013.01); *H03H 9/0576* (2013.01); *H03H 2001/0085* (2013.01)

(58) Field of Classification Search
  CPC ............... H03H 2001/0085; H03H 7/0115; H03H 7/1708; H03H 7/1775; H03H 7/0161
  USPC ................................................ 333/185, 175
  See application file for complete search history.

(56) References Cited

U.S. PATENT DOCUMENTS

| 6,222,427 | B1 | 4/2001 | Kato et al. |
| 2002/0048872 | A1 | 4/2002 | Yamaguchi |
| 2007/0241839 | A1 | 10/2007 | Taniguchi |
| 2010/0039189 | A1 | 2/2010 | Taniguchi |
| 2010/0265015 | A1* | 10/2010 | Hoeft et al. ............... 333/219.1 |
| 2010/0283557 | A1 | 11/2010 | Taniguchi |
| 2012/0032758 | A1 | 2/2012 | Mori et al. |
| 2014/0145798 | A1 | 5/2014 | Masuda |

FOREIGN PATENT DOCUMENTS

| JP | 9-35936 A | 2/1997 |
| JP | 2002-76807 A | 3/2002 |
| JP | 2002-76809 A | 3/2002 |
| JP | 2003-115735 A | 4/2003 |
| JP | 2003-174263 A | 6/2003 |
| WO | 2007/119356 A1 | 10/2007 |

(Continued)

OTHER PUBLICATIONS

Official Communication issued in corresponding Japanese Patent Application No. 2012-121169, mailed on May 27, 2014.

*Primary Examiner* — Benny Lee
*Assistant Examiner* — Rakesh Patel
(74) *Attorney, Agent, or Firm* — Keating & Bennett, LLP

(57) ABSTRACT

A laminated body includes a plurality of insulator layers that are laminated to one another. First and second LC parallel resonators are loop-shaped or substantially loop-shaped and include via hole conductors extending in a z-axis direction and conductor layers provided on the insulator layers, and define a band pass filter. A first loop surface surrounded by the first LC parallel resonator is parallel or substantially parallel to a second loop surface surrounded by the second LC parallel resonator, and is disposed within the second loop surface in planar view in an x-axis direction.

20 Claims, 9 Drawing Sheets

(56) References Cited

FOREIGN PATENT DOCUMENTS

| WO | 2008/143071 | A1 | 11/2008 |
| WO | 2009/142113 | A1 | 11/2009 |
| WO | 2010/122930 | A1 | 10/2010 |
| WO | 2012/066946 | A1 | 5/2012 |

* cited by examiner

ELECTRONIC COMPONENT

BACKGROUND OF THE INVENTION

1. Field of the Invention

The present invention relates to an electronic component, and more particularly, to an electronic component including a band pass filter.

2. Description of the Related Art

As an electronic component of the related art, for example, a laminated band pass filter is disclosed in International Publication No. WO 2007/119356. FIG. 9 is the exploded perspective view of a laminated band pass filter 500 described in International Publication No. WO 2007/119356.

The laminated band pass filter 500 includes a laminated body 502 and LC parallel resonators 504, 506, 508, 510, and 512. A plurality of insulator layers are laminated, and thus, the laminated body 502 is provided. The LC parallel resonators 504, 506, 508, 510, and 512 are defined by conductor layers and via hole conductors, and have substantial loop shapes in planar view in a direction perpendicular to a lamination direction. The loop surfaces of the LC parallel resonators 504, 506, 508, 510, and 512 overlap with one another.

In the laminated band pass filter 500 configured as described above, the loop surfaces of the LC parallel resonators 504, 506, 508, 510, and 512 are slightly misaligned. Accordingly, the degree of coupling between the LC parallel resonators 504, 506, 508, 510, and 512 is reduced, and it may be possible to achieve band narrowing of the pass band of the laminated band pass filter 500.

However, when the degree of coupling between the LC parallel resonators 504, 506, 508, 510, and 512 is reduced, it may be difficult for a high-frequency signal to pass between the LC parallel resonators, and the transmission loss of the high-frequency signal in the pass band occurs. As a result, the insertion loss of the laminated band pass filter 500 is increased.

SUMMARY OF THE INVENTION

Preferred embodiments of the present invention provide an electronic component that is capable of achieving band narrowing of a pass band and reducing the transmission loss of a high-frequency signal in the pass band.

According to a preferred embodiment of the present invention, an electronic component includes a laminated body including a plurality of insulator layers that are laminated to each other, and a first LC parallel resonator and a second LC parallel resonator that are substantially loop-shaped LC parallel resonators including via hole conductors extending in a lamination direction and conductor layers that are provided on the insulator layer and configure a band pass filter, wherein a first loop surface surrounded by the first LC parallel resonator is parallel or substantially parallel to a second loop surface surrounded by the second LC parallel resonator, and is disposed within the second loop surface in planar view in a direction perpendicular or substantially perpendicular to the second loop surface.

According to various preferred embodiments of the present invention, it is possible to achieve band narrowing of a pass band and reduce the transmission loss of a high-frequency signal in the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, an electronic component according to preferred embodiments of the present invention will be described.

Figure 1:
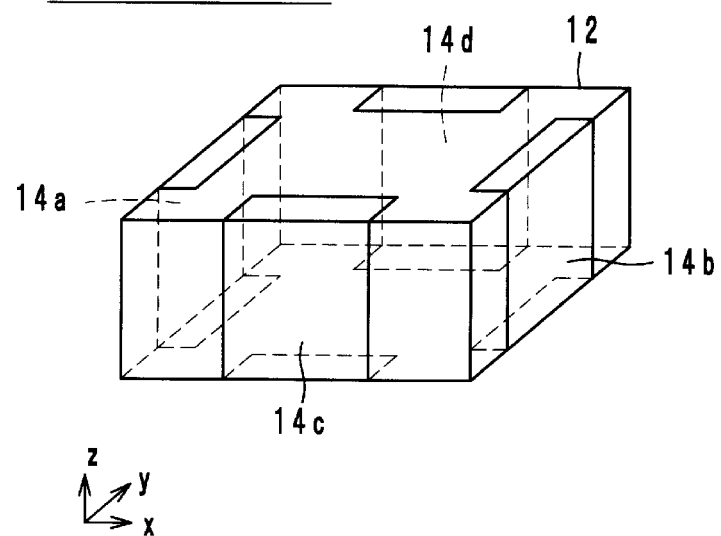
FIG. 1 is a perspective view of an electronic component according to a preferred embodiment of the present invention.
Figure 2:
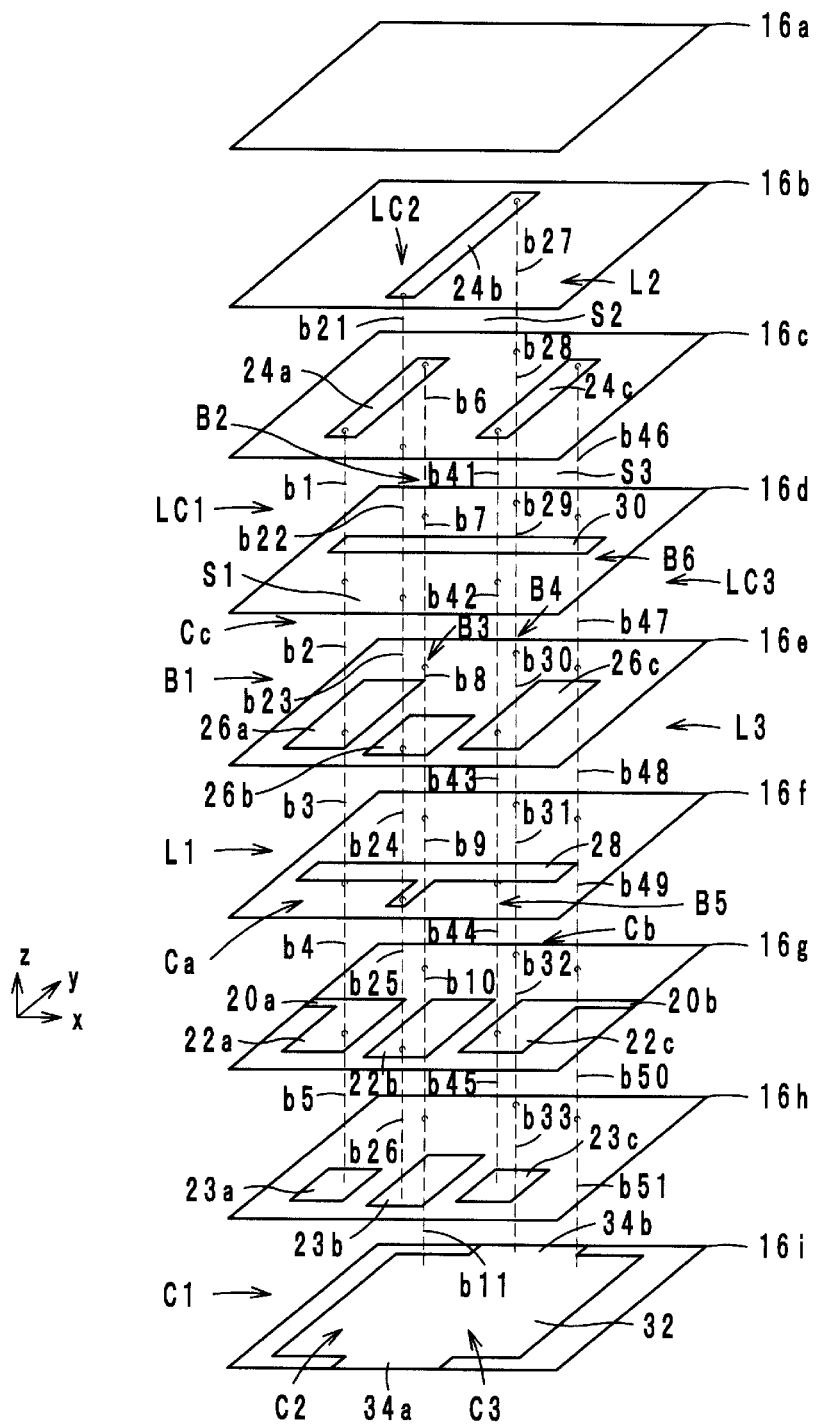
FIG. 2 is an exploded perspective view of a laminated body of an electronic component according to a preferred embodiment of the present invention.
Figure 3:
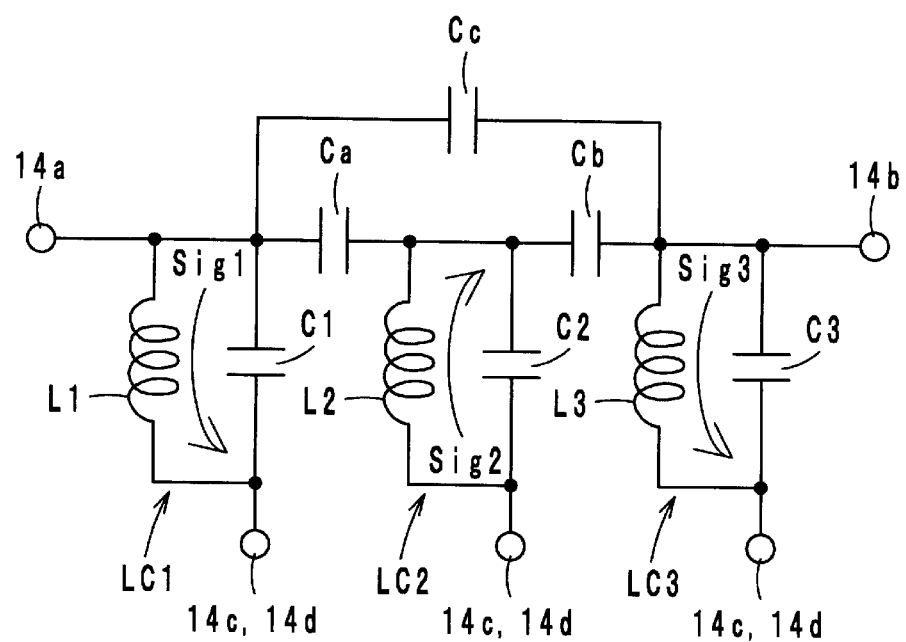
FIG. 3 is an equivalent circuit diagram of an electronic component according to a preferred embodiment of the present invention.

Hereinafter, the configuration of an electronic component according to preferred embodiments of the present invention will be described with reference to drawings. FIG. 1 is a perspective view of an electronic component 10 according to a preferred embodiment of the present invention. FIG. 2 is the exploded perspective view of a laminated body 12 of the electronic component 10. FIG. 3 is the equivalent circuit diagram of the electronic component 10. In FIG. 1 and FIG. 2, a z-axis direction indicates the lamination direction of insulator layers 16. In addition, an x-axis direction indicates a direction along the long side of the electronic component 10, and a y-axis direction indicates a direction along the short side of the electronic component 10.

As illustrated in FIG. 1 and FIG. 2, the electronic component 10 includes the laminated body 12, outer electrodes 14 (14a to 14d), LC parallel resonators LC1 to LC3, capacitors Ca to Cc, and extraction conductor layers 20 (20a, 20b) and 34 (34a, 34b).

As illustrated in FIG. 2, the laminated body 12 includes the insulator layers 16 (16a to 16i) that are laminated to each other and that preferably include a ceramic dielectric material and has a rectangular or substantially rectangular parallelepiped shape. In addition, the laminated body 12 includes the LC parallel resonators LC1 to LC3 and the capacitors Ca to Cc embedded therein.

As illustrated in FIG. 1, the outer electrode 14a is provided on a side surface on a negative direction side in the x-axis direction and defines an input electrode. The outer electrode 14b is provided on a side surface on a positive direction side in the x-axis direction and defines an output electrode. The outer electrode 14c is provided on a side surface on a negative direction side in the y-axis direction and defines a ground electrode. The outer electrode 14d is provided on a side surface on a positive direction side in the y-axis direction and defines a ground electrode.

As illustrated in FIG. 2, the insulator layers 16 preferably have rectangular or substantially rectangular shapes, and are preferably made of, for example, ceramic dielectrics. The insulator layers 16a to 16i are laminated so as to be arranged in this order in the z-axis direction. Hereinafter, a surface of the insulator layer 16, located on the positive direction side in the z-axis direction, is referred to as a front surface, and a surface of the insulator layer 16, located on the negative direction side in the z-axis direction, is referred to as a back surface.

In planar view in the z-axis direction, the LC parallel resonators LC1 to LC3 are arranged in this order from the negative direction side to the positive direction side in the x-axis direction, and define a band pass filter.

The LC parallel resonator LC1 includes a coil L1 and a capacitor C1. In more detail, the LC parallel resonator LC1 includes via hole conductors b1 to b11, capacitor conductor layers 22a and 23a, a coil conductor layer 24a, and a ground conductor layer 32, and preferably is loop-shaped or substantially loop-shaped.

The capacitor C1 is defined by the capacitor conductor layers 22a and 23a and the ground conductor layer 32. The ground conductor layer 32 is preferably a rectangular or substantially rectangular shaped conductor layer covering substantially the entire front surface of the insulator layer 16i. The capacitor conductor layer 22a is a conductor layer facing the ground conductor layer 32 through the insulator layers 16g and 16h, and provided on the front surface of the insulator layer 16g. Accordingly, electrostatic capacitance occurs between the capacitor conductor layer 22a and the ground conductor layer 32. The capacitor conductor layer 22a preferably has a rectangular or substantially rectangular shape having a longitudinal direction in the y-axis direction, and is provided on the negative direction side in the x-axis direction, as compared to the intersection point between the diagonal lines of the insulator layer 16g.

The capacitor conductor layer 23a is a conductor layer facing the ground conductor layer 32 through the insulator layer 16h, and provided on the front surface of the insulator layer 16h. Accordingly, electrostatic capacitance occurs between the capacitor conductor layer 23a and the ground conductor layer 32. The capacitor conductor layer 23a preferably has a rectangular or substantially rectangular shape having a longitudinal direction in the y-axis direction, and is provided on the negative direction side in the x-axis direction, as compared to the intersection point between the diagonal lines of the insulator layer 16h.

The coil L1 includes the via hole conductors b1 to b11 and the coil conductor layer 24a. The coil conductor layer 24a is provided in the front surface of the insulator layer 16c, and a linear or substantially linear conductor extending in the y-axis direction. The coil conductor layer 24a is provided on the negative direction side in the x-axis direction, as compared to the intersection point between the diagonal lines of the insulator layer 16c.

The via hole conductors b1 to b5 individually penetrate the insulator layers 16c to 16g in the z-axis direction. The end portion of the via hole conductor b1, located on the positive direction side in the z-axis direction, is connected to the end portion of the coil conductor layer 24a, located on the negative direction side in the y-axis direction. In addition, the end portion of the via hole conductor b4, located on the negative direction side in the z-axis direction, is connected to the capacitor conductor layer 22a. The end portion of the via hole conductor b5, located on the negative direction side in the z-axis direction, is connected to the capacitor conductor layer 23a. Accordingly, the via hole conductors b1 to b5 define one via hole conductor B1 extending from the end portion of the coil conductor layer 24a, located on the negative direction side in the y-axis direction, toward the negative direction side in the z-axis direction, and are connected to the capacitor conductor layers 22a and 23a.

The via hole conductors b6 to b11 individually penetrate the insulator layers 16c to 16h in the z-axis direction, and are provided on the positive direction side in the y-axis direction, as compared to the via hole conductors b1 to b5. The end portion of the via hole conductor b6, located on the positive direction side in the z-axis direction, is connected to the end portion of the coil conductor layer 24a, located on the positive direction side in the y-axis direction. In addition, the end portion of the via hole conductor b11, located on the negative direction side in the z-axis direction, is connected to the ground conductor layer 32. Accordingly, the via hole conductors b6 to b11 define one via hole conductor B2 extending from the end portion of the coil conductor layer 24a, located on the positive direction side in the y-axis direction, toward the negative direction side in the z-axis direction, and are connected to the ground conductor layer 32.

In this manner, in a y-z plane, the coil L1 preferably is loop-shaped or substantially loop-shaped and includes one end that is a connection point between the via hole conductor b5 and the capacitor conductor layer 23a and another end that is a connection point between the via hole conductor b11 and the ground conductor layer 32, and which passes through the via hole conductors b1 to b5, the coil conductor layer 24a, and the via hole conductors b6 to b11.

The LC parallel resonator LC1 configured as described above defines a loop surface S1 parallel or substantially parallel to the y-z plane. The loop surface S1 is a virtual plane surface having a rectangular or substantially rectangular shape surrounded by the LC parallel resonator LC1.

The LC parallel resonator LC2 includes a coil L2 and a capacitor C2. In more detail, the LC parallel resonator LC2 includes via hole conductors b21 to b33, capacitor conductor layers 22b and 23b, a coil conductor layer 24b, and the ground conductor layer 32, and preferably is loop-shaped or substantially loop-shaped.

The capacitor C2 includes the capacitor conductor layers 22b and 23b and the ground conductor layer 32. The ground conductor layer 32 is preferably a rectangular or substantially rectangular shaped conductor layer covering substantially the entire front surface of the insulator layer 16i. The capacitor conductor layer 22b is a conductor layer facing the ground conductor layer 32 through the insulator layers 16g and 16h, and provided on the front surface of the insulator layer 16g. Accordingly, electrostatic capacitance occurs between the capacitor conductor layer 22b and the ground conductor layer 32. The capacitor conductor layer 22b preferably has a rectangular or substantially rectangular shape having a longitudinal direction in the y-axis direction, and is provided on the intersection point between the diagonal lines of the insulator layer 16g.

The capacitor conductor layer 23b is a conductor layer facing the ground conductor layer 32 through the insulator layer 16h, and provided on the front surface of the insulator layer 16h. Accordingly, electrostatic capacitance occurs between the capacitor conductor layer 23b and the ground conductor layer 32. The capacitor conductor layer 23b preferably has a rectangular or substantially rectangular shape having a longitudinal direction in the y-axis direction, and is provided on the diagonal line of the insulator layer 16h.

The coil L2 includes the via hole conductors b21 to b33 and the coil conductor layer 24b. The coil conductor layer 24b is provided in the front surface of the insulator layer 16b, and a linear or substantially linear conductor extending in the y-axis direction. The coil conductor layer 24b is provided on the intersection point between the diagonal lines of the insulator layer 16b. Accordingly, the coil conductor layer 24b is provided on the positive direction side in the z-axis direction, as compared to the coil conductor layer 24a. In addition, the length of the coil conductor layer 24b in the y-axis direction is longer than the length of the coil conductor layer 24a in the y-axis direction.

The via hole conductors b21 to b26 individually penetrate the insulator layers 16b to 16g in the z-axis direction. The end portion of the via hole conductor b21, located on the positive direction side in the z-axis direction, is connected to the end portion of the coil conductor layer 24b, located on the negative direction side in the y-axis direction. In addition, the end portion of the via hole conductor b25, located on the negative direction side in the z-axis direction, is connected to the capacitor conductor layer 22b. The end portion of the via hole conductor b26, located on the negative direction side in the z-axis direction, is connected to the capacitor conductor layer 23b. Accordingly, the via hole conductors b21 to b26 define one via hole conductor B3 extending from the end portion of the coil conductor layer 24b, located on the negative direction side in the y-axis direction, toward the negative direction side in the z-axis direction, and are connected to the capacitor conductor layers 22b and 23b. The via hole conductor B3 is preferably longer than the via hole conductor B1.

The via hole conductors b27 to b33 individually penetrate the insulator layers 16b to 16h in the z-axis direction, and are provided on the positive direction side in the y-axis direction, as compared to the via hole conductors b21 to b26. The end portion of the via hole conductor b27, located on the positive direction side in the z-axis direction, is connected to the end portion of the coil conductor layer 24b, located on the positive direction side in the y-axis direction. In addition, the end portion of the via hole conductor b33, located on the negative direction side in the z-axis direction, is connected to the ground conductor layer 32. Accordingly, the via hole conductors b27 to b33 define one via hole conductor B4 extending from the end portion of the coil conductor layer 24b, located on the positive direction side in the y-axis direction, toward the negative direction side in the z-axis direction, and are connected to the ground conductor layer 32. The via hole conductor B4 is preferably longer than the via hole conductor B2.

In addition, the length of the coil conductor layer 24b in the y-axis direction is preferably longer than the length of the coil conductor layer 24a in the y-axis direction. Accordingly, a distance between the via hole conductor B3 and the via hole conductor B4 is preferably greater than a distance between the via hole conductor B1 and the via hole conductor B2.

In this manner, in the y-z plane, the coil L2 preferably is loop-shaped or substantially loop-shaped and includes one end that is a connection point between the via hole conductor b26 and the capacitor conductor layer 23b and another end that is a connection point between the via hole conductor b33 and the ground conductor layer 32, and which passes through the via hole conductors b21 to b26, the coil conductor layer 24b, and the via hole conductors b27 to b33.

The LC parallel resonator LC2 configured as described above defines a loop surface S2 parallel or substantially parallel to the y-z plane. The loop surface S2 is a virtual plane surface having a rectangular or substantially rectangular shape surrounded by the LC parallel resonator LC2.

The LC parallel resonator LC3 includes a coil L3 and a capacitor C3. In more detail, the LC parallel resonator LC3 includes via hole conductors b41 to b51, capacitor conductor layers 22c and 23c, a coil conductor layer 24c, and the ground conductor layer 32, and preferably is loop-shaped or substantially loop-shaped.

The capacitor C3 includes the capacitor conductor layers 22c and 23c and the ground conductor layer 32. The ground conductor layer 32 is preferably a rectangular or substantially rectangular shaped conductor layer covering substantially the entire front surface of the insulator layer 16i. The capacitor conductor layer 22c is a conductor layer facing the ground conductor layer 32 through the insulator layers 16g and 16h, and provided on the front surface of the insulator layer 16g. Accordingly, electrostatic capacitance occurs between the capacitor conductor layer 22c and the ground conductor layer 32. The capacitor conductor layer 22c preferably has a rectangular or substantially rectangular shape having a longitudinal direction in the y-axis direction, and is provided on the positive direction side in the x-axis direction, as compared to the intersection point between the diagonal lines of the insulator layer 16g.

The capacitor conductor layer 23c is a conductor layer facing the ground conductor layer 32 through the insulator layer 16h, and provided on the front surface of the insulator layer 16h. Accordingly, electrostatic capacitance occurs between the capacitor conductor layer 23c and the ground conductor layer 32. The capacitor conductor layer 23c preferably has a rectangular or substantially rectangular shape having a longitudinal direction in the y-axis direction, and is provided on the positive direction side in the x-axis direction, compared with the point of intersection between the diagonal lines of the insulator layer 16h.

The coil L3 includes the via hole conductors b41 to b51 and the coil conductor layer 24c. The coil conductor layer 24c is provided in the front surface of the insulator layer 16c, and a substantially linear conductor extending in the y-axis direction. The coil conductor layer 24c is provided on the positive direction side in the x-axis direction, compared with the point of intersection between the diagonal lines of the insulator layer 16c. The length of the coil conductor layer 24c in the y-axis direction is the same or substantially the same as the length of the coil conductor layer 24a in the y-axis direction.

The via hole conductors b41 to b45 individually penetrate the insulator layers 16c to 16g in the z-axis direction. The end portion of the via hole conductor b41, located on the positive direction side in the z-axis direction, is connected to the end portion of the coil conductor layer 24c, located on the negative direction side in the y-axis direction. In addition, the end portion of the via hole conductor b44, located on the negative direction side in the z-axis direction, is connected to the capacitor conductor layer 22c. The end portion of the via hole conductor b45, located on the negative direction side in the z-axis direction, is connected to the capacitor conductor layer 23c. Accordingly, the via hole conductors b41 to b45 define one via hole conductor B5 extending from the end portion of the coil conductor layer 24c, located on the negative direction side in the y-axis direction, toward the negative direction side in the z-axis direction, and are connected to the capacitor conductor layers 22c and 23c. The length of the via hole conductor B5 is preferably the same or substantially the same as the length of the via hole conductor B1.

The via hole conductors b46 to b51 individually penetrate the insulator layers 16c to 16h in the z-axis direction, and are provided on the positive direction side in the y-axis direction, compared with the via hole conductors b41 to b45. The end portion of the via hole conductor b46, located on the positive direction side in the z-axis direction, is connected to the end portion of the coil conductor layer 24c, located on the positive direction side in the y-axis direction. The end portion of the via hole conductor b51, located on the negative direction side in the z-axis direction, is connected to the ground conductor layer 32. Accordingly, the via hole conductors b46 to b51 define one via hole conductor B6 extending from the end portion of the coil conductor layer 24c, located on the positive direction side in the y-axis direction, toward the negative direction side in the z-axis direction, and are connected to the ground conductor layer 32. The length of the via hole conductor B6 is preferably the same or substantially the same as the length of the via hole conductor B2.

In addition, the length of the coil conductor layer 24c in the y-axis direction is preferably the same or substantially the same as the length of the coil conductor layer 24a in the y-axis direction. Accordingly, a distance between the via hole conductor B3 and the via hole conductor B4 is preferably greater than a distance between the via hole conductor B5 and the via hole conductor B6.

In this manner, in the y-z plane, the coil L3 preferably is loop-shaped or substantially loop-shaped and includes one end that is a connection point between the via hole conductor b45 and the capacitor conductor layer 23c and another end that is a connection point between the via hole conductor b51 and the ground conductor layer 32, and which passes through the via hole conductors b41 to b45, the coil conductor layer 24c, and the via hole conductors b46 to b51.

The LC parallel resonator LC3 configured as described above defines a loop surface S3 parallel or substantially parallel to the y-z plane. The loop surface S3 is a virtual plane surface having a rectangular or substantially rectangular shape surrounded by the LC parallel resonator LC3.

The loop surfaces S1 to S3 of the LC parallel resonators LC1 to LC3 are preferably parallel or substantially parallel to the y-z plane (namely, parallel or substantially parallel to the z-axis direction and parallel or substantially parallel to the y-axis direction). The loop surface S1 and the loop surface S3 sandwich the loop surface S2 therebetween. Accordingly, as illustrated in FIG. 3, the coil L1 of the LC parallel resonator LC1 and the coil L2 of the LC parallel resonator LC2 are electromagnetic-field coupled to each other. In addition, the coil L2 of the LC parallel resonator LC2 and the coil L3 of the LC parallel resonator LC3 are electromagnetic-field coupled to each other.

In addition, the coil conductor layer 24b is provided on the positive direction side in the z-axis direction, as compared to the coil conductor layers 24a and 24c. Furthermore, the length of the coil conductor layer 24b in the y-axis direction is preferably longer than the lengths of the coil conductor layers 24a and 24c in the y-axis direction. Accordingly, in planar view in the x-axis direction, the loop surfaces S1 and S3 are disposed within the loop surface S2. In other words, in planar view in the x-axis direction, the loop surfaces S1 and S3 do not protrude from the loop surface S2.

The capacitor Ca includes the capacitor conductor layer 22a, a capacitor conductor layer 26a, and a coupling conductor layer 28. The coupling conductor layer 28 is provided on the front surface of the insulator layer 16f, and preferably is T-shaped or substantially T-shaped. Furthermore, the coupling conductor layer 28 is connected to the end portion of the via hole conductor b24, located on the negative direction side in the z-axis direction, and the end portion of the via hole conductor b25, located on the positive direction side in the z-axis direction. The capacitor conductor layer 22a is a conductor layer facing the coupling conductor layer 28 through the insulator layer 16f, and provided on the front surface of the insulator layer 16g. The capacitor conductor layer 26a is a conductor layer facing the coupling conductor layer 28 through the insulator layer 16e, and provided on the front surface of the insulator layer 16e. Accordingly, electrostatic capacitance occurs between the capacitor conductor layers 22a and 26a and the coupling conductor layer 28, and the capacitor Ca is provided. The capacitor conductor layer 26a preferably has a rectangular or substantially rectangular shape having a longitudinal direction in the y-axis direction, and is provided on the negative direction side in the x-axis direction, as compared to the intersection point between the diagonal lines of the insulator layer 16e.

In addition, a capacitor conductor layer 26b is a conductor layer facing the coupling conductor layer 28 through the via hole conductor b24, and provided on the front surface of the insulator layer 16e. The capacitor conductor layer 26b preferably has a rectangular or substantially rectangular shape having a longitudinal direction in the y-axis direction, and is provided on the intersection point between the diagonal lines of the insulator layer 16e. In addition, the capacitor conductor layer 22b is connected to the coupling conductor layer 28 through the via hole conductor b25, and the capacitor conductor layer 23b is connected to the coupling conductor layer 28 through the via hole conductors b25 and b26. As described above, the LC parallel resonator LC1 and the LC parallel resonator LC2 are capacitively coupled to each other through the capacitor Ca.

The capacitor Cb includes the capacitor conductor layer 22c, a capacitor conductor layer 26c, and the coupling conductor layer 28. The coupling conductor layer 28 is provided on the front surface of the insulator layer 16f, and preferably is loop-shaped or substantially loop-shaped. Furthermore, the coupling conductor layer 28 is connected to the end portion of the via hole conductor b24, located on the negative direction side in the z-axis direction, and the end portion of the via hole conductor b25, located on the positive direction side in the z-axis direction. The capacitor conductor layer 22c is a conductor layer facing the coupling conductor layer 28 through the insulator layer 16f, and provided on the front surface of the insulator layer 16g. The capacitor conductor layer 26c is a conductor layer facing the coupling conductor layer 28 through the insulator layer 16e, and provided on the front surface of the insulator layer 16e. Accordingly, electrostatic capacitance occurs between the capacitor conductor layers 22c and 26c and the coupling conductor layer 28, and the capacitor Cb is provided. The capacitor conductor layer 26c preferably has a rectangular or substantially rectangular shape having a longitudinal direction in the y-axis direction, and is provided on the positive direction side in the x-axis direction, as compared to the intersection point between the diagonal lines of the insulator layer 16e.

As described above, the LC parallel resonator LC3 and the LC parallel resonator LC2 are capacitively coupled to each other through the capacitor Cb. Accordingly, the capacitor Cb is provided.

The capacitor Cc includes the capacitor conductor layers 26a and 26c and a coupling conductor layer 30. The coupling conductor layer 30 is provided on the front surface of the insulator layer 16d, and extends in the x-axis direction. Accordingly, the coupling conductor layer 30 faces the capacitor conductor layers 26a and 26c through the insulator layer 16d. As a result, electrostatic capacitance occurs between the capacitor conductor layer 26a and the coupling conductor layer 30, and electrostatic capacitance occurs between the capacitor conductor layer 26c and the coupling conductor layer 30. As described above, the capacitor conductor layers 26a and 26c are capacitively coupled to each other through the coupling conductor layer 30. Accordingly, the capacitor Cc is provided.

In addition, the length of the capacitor conductor layer 26b in the y-axis direction is preferably shorter than the lengths of the capacitor conductor layers 26a and 26c in the y-axis direction. Accordingly, in planar view in the z direction, the coupling conductor layer 30 does not overlap with the capacitor conductor layer 26b.

The extraction conductor layer 20a is provided on the front surface of the insulator layer 16g, connected to the capacitor conductor layer 22a, and extends to the short side of the insulator layer 16g, located on the negative direction side in the x-axis direction. Accordingly, the extraction conductor layer 20a is connected to the outer electrode 14a. As a result, the LC parallel resonator LC1 is electrically connected to the outer electrode 14a through the extraction conductor layer 20a.

The extraction conductor layer 20b is provided on the front surface of the insulator layer 16g, connected to the capacitor conductor layer 22c, and extends to the short side of the insulator layer 16g, located on the positive direction side in the x-axis direction. Accordingly, the extraction conductor layer 20b is connected to the outer electrode 14b. As a result, the LC parallel resonator LC3 is electrically connected to the outer electrode 14b through the extraction conductor layer 20b.

The extraction conductor layer 34a is provided on the front surface of the insulator layer 16i, connected to the ground conductor layer 32, and extends to the long side of the insulator layer 16i, located on the negative direction side in the y-axis direction. Accordingly, the extraction conductor layer 34a is connected to the outer electrode 14c. As a result, each of the LC parallel resonators LC1 to LC3 is electrically connected to the outer electrode 14c through the extraction conductor layer 34a.

The extraction conductor layer 34b is provided on the front surface of the insulator layer 16i, connected to the ground conductor layer 32, and extends to the long side of the insulator layer 16i, located on the positive direction side in the y-axis direction. Accordingly, the extraction conductor layer 34b is connected to the outer electrode 14d. As a result, each of the LC parallel resonators LC1 to LC3 is electrically connected to the outer electrode 14d through the extraction conductor layer 34b.

Next, an example of the operation of the electronic component 10 will be described with reference to FIG. 1 to FIG. 3. First, a high-frequency signal Sig1 input from the outer electrode 14a flows in the LC parallel resonator LC1 as illustrated in FIG. 3.

The coil L1 and the coil L2 are electromagnetic-field coupled to each other. Therefore, when the high-frequency signal Sig1 flows in the LC parallel resonator LC1, a high-frequency signal Sig2 flows in the LC parallel resonator LC2 due to electromagnetic induction.

The coil L2 and the coil L3 are electromagnetic-field coupled to each other. Therefore, when the high-frequency signal Sig2 flows in the LC parallel resonator LC2, a high-frequency signal Sig3 flows in the LC parallel resonator LC3 due to electromagnetic induction. Accordingly, the high-frequency signal Sig3 is output from the outer electrode 14b.

Here, the LC parallel resonators LC1 to LC3 have natural resonant frequencies defined based on the coils L1 to L3 and the capacitors C1 to C3, respectively. In addition, the impedances of the LC parallel resonators LC1 to LC3 become high at these resonant frequencies. Accordingly, the high-frequency signal Sig3 having a predetermined frequency band defined based on these resonant frequencies is output from the outer electrode 14b.

Next, a non-limiting example of a manufacturing method for the electronic component 10 will be described with reference to FIG. 1 and FIG. 2.

First, ceramic green sheets to be the insulator layers 16 are prepared. Next, the via hole conductors b1 to b11, b21 to b33, and b41 to b51 are individually formed in the ceramic green sheets to be the insulator layers 16b to 16h. Specifically, the ceramic green sheets to be the insulator layers 16b to 16h are irradiated with a laser beam, and via holes are formed therein. Next, with a method, such as printing or applying, for example, the via holes are filled preferably with a conductive paste, such as Ag, Pd, Cu, Au, or the alloy thereof, for example.

Next, with a method, such as a screen printing method or a photolithographic method, for example, a conductive paste whose main component is preferably Ag, Pd, Cu, Au, or the alloy thereof, for example, is applied on the ceramic green sheets to be the insulator layers 16b to 16i, and thus, the extraction conductor layers 20a and 20b, the capacitor conductor layers 22a to 22c, 23a to 23c, and 26a to 26c, the coil conductor layers 24a to 24c, the coupling conductor layers 28 and 30, the ground conductor layer 32, and the extraction conductor layers 34a and 34b are formed. In addition, when forming the extraction conductor layers 20a and 20b, the capacitor conductor layers 22a to 22c, 23a to 23c, and 26a to 26c, the coil conductor layers 24a to 24c, the coupling conductor layers 28 and 30, the ground conductor layer 32, and the extraction conductor layers 34a and 34b, the via holes may preferably also be filled with a conductive paste.

Next, individual ceramic green sheets are laminated. Specifically, a ceramic green sheet to be the insulator layer 16i is provided. Next, a ceramic green sheet to be the insulator layer 16h is disposed on the ceramic green sheet to be the insulator layer 16i. After that, the ceramic green sheet to be the insulator layer 16h is pressure-bonded to the ceramic green sheet to be the insulator layer 16i. After that, in the same or substantially the same manner, ceramic green sheets to be 16g, 16f, 16e, 16d, 16c, 16b, and 16a are also subjected to lamination and pressure bonding in this order. With the above-mentioned process, a mother laminated body is formed. The mother laminated body is subjected to main pressure bonding using an isostatic press or other suitable device.

Next, using a cutting blade, the mother laminated body is cut into the laminated body 12 having a predetermined dimension. A binder removal process and firing are performed on the unfired laminated body 12.

With the above-mentioned process, the fired laminated body 12 is obtained. The laminated body 12 is subjected to barrel processing and chamfered. After that, with a method such as, for example, a dipping method, an electrode paste whose main component is preferably silver, for example, is applied to and burned into the surface of the laminated body 12, and thus, a silver electrode defining the outer electrode 14 is formed.

Finally, Ni plating or Sn plating is preferably performed on the surface of the silver electrode, and thus, the outer electrode 14 is formed. Using the above-mentioned process, such an electronic component 10 as illustrated in FIG. 1 is completed.

According to the electronic component 10 configured as described above, it is possible to achieve band narrowing of a pass band. In more detail, in the electronic component 10, in planar view in the x-axis direction, the loop surfaces S1 and S3 are disposed within the loop surface S2. Accordingly, in planar view in the x-axis direction, the via hole conductor B3 does not overlap with the via hole conductors B1 and B5. In the same or substantially the same manner, in planar view in the x-axis direction, the via hole conductor B4 does not overlap with the via hole conductors B2 and B6. In addition, in planar view in the x-axis direction, the coil conductor layer 24b does not overlap with the coil conductor layers 24a and 24c. Accordingly, in the electronic component 10, electromagnetic field coupling between the via hole conductor B3 and the via hole conductors B1 and B5, electromagnetic field coupling between the via hole conductor B4 and the via hole conductors B2 and B6, and electromagnetic field coupling between the coil conductor layer 24b and the coil conductor layers 24a and 24c are weakened. Accordingly, in the electronic component 10, it is possible to reduce the degree of coupling between the LC parallel resonators LC1 and LC2 and the degree of coupling between the LC parallel resonators LC2 and LC3. As a result, in the electronic component 10, it is possible to achieve band narrowing of a pass band.

In addition, according to the electronic component 10, it is possible to reduce the transmission loss of a high-frequency signal. In more detail, in planar view in the x-axis direction, the loop surfaces S1 and S3 are disposed within the loop surface S2. In other words, in the electronic component 10, the loop surface S2 is preferably larger than the loop surfaces S1 and S3. Accordingly, the internal diameter of the coil L2, viewed in the x-axis direction, is preferably greater than the internal diameters of the coils L1 and L3. As a result, the inductance value of the coil L2 is large, and the Q value of the LC parallel resonator LC2 is large. When the Q value of the LC parallel resonator LC2 is large, the transmission loss of a high-frequency signal in the LC parallel resonator LC2 is reduced. In such a manner as described above, according to the electronic component 10, the transmission loss of a high-frequency signal in a pass band is reduced.

In addition, according to the electronic component 10, the Q value of the LC parallel resonator LC2 provided in the center in the x-axis direction within the three LC parallel resonators LC1 to LC3 is large. Accordingly, in the electronic component 10, in particular, the reduction of an insertion loss in the low frequency domain of the pass band is achieved.

In addition, according to the electronic component 10, it is be possible to minimize or prevent fluctuations of a transmission characteristic caused by production tolerances. In more detail, in the electronic component 10, in planar view in the x-axis direction, the loop surfaces S1 and S3 are disposed within the loop surface S2. Therefore, even if misalignment occurs in the loop surfaces S1 to S3 due to lamination misalignment or other misalignment, protruding of the loop surfaces S1 and S3 outside the loop surface S2 is significantly reduced or prevented. As a result, fluctuations in the degree of coupling between the LC parallel resonators LC1 to LC3 due to the lamination misalignment are significantly reduced or prevented. In such a manner as described above, according to the electronic component 10, fluctuations of the transmission characteristic due to the production tolerance are significantly reduced or prevented.

In addition, according to the electronic component 10, when viewed in the z-axis direction, the coupling conductor layer 30 defining the capacitor Cc does not overlap with the capacitor conductor layer 26b. Therefore, during the formation of the coupling capacitance between the resonator LC1 and the resonator LC3, unnecessary capacitance is not produced between the coupling conductor layer 30 and the resonator LC2. Accordingly, the design of coupling capacitance between resonators is facilitated.

To further clarify the advantages achieved by the electronic component 10, the inventor of the present invention performed computer simulations to be described hereinafter. In more detail, a first model of the electronic component 10 and a second model of an electronic component according to the comparative example were created. In planar view in the x-axis direction, the electronic component according to the comparative example has a structure in which the sizes of each of the loop surfaces of the three LC parallel resonators are the same or substantially the same as one another and the three loop surfaces substantially overlap with one another when being viewed in the x-axis direction. The inventor of the present application studied the transmission characteristics of the first model and the second model. The transmission characteristic is the attenuation of an output signal output from the outer electrode 14b with respect to an input signal input from the outer electrode 14a.

Figure 4A:
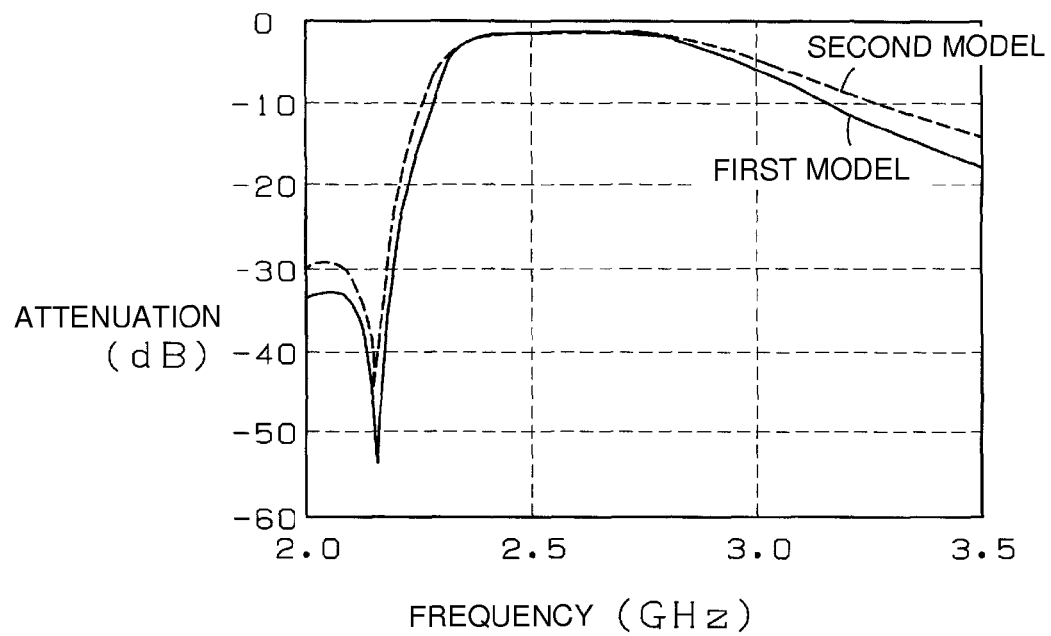
FIGS. 4A and 4B are graphs illustrating simulation results.
Figure 4B:
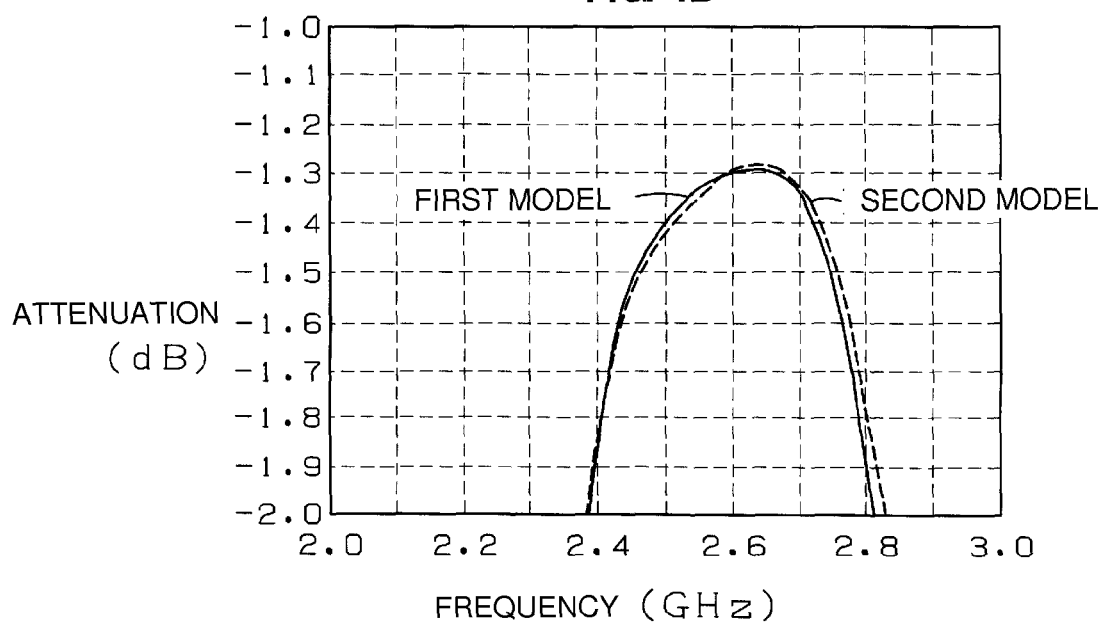

FIGS. 4A and 4B are graphs illustrating simulation results. A vertical axis indicates attenuation, and a horizontal axis indicates a frequency. FIG. 4A is a graph illustrating a transmission characteristic in about 2.0 GHz to about 3.5 GHz, and FIG. 4B is a graph enlarging about 2.0 GHz to about 3.0 GHz in the graph in FIG. 4A.

As illustrated in FIG. 4A, the pass band of the first model is narrower than the pass band of the second model, for example, at the attenuation of about −1.8 dB. In other words, the loop surfaces S1 and S3 are disposed within the loop surface S2 in planar view in the x-axis direction, and thus, in the electronic component 10, band narrowing of the pass band of a high-frequency signal is achieved.

In addition, as illustrated in FIG. 4B, attenuation in the low frequency domain (in the vicinity of about 2.5 GHz) of the pass band of the first model is smaller than attenuation in the low frequency domain (in the vicinity of about 2.5 GHz) of the pass band of the second model. Accordingly, in the electronic component 10, the Q value of the LC parallel resonator LC2 provided in the center in the x-axis direction within the three LC parallel resonators LC1 to LC3 is large, and thus, the reduction of an insertion loss in the low frequency domain of the pass band is achieved.

Figure 5:
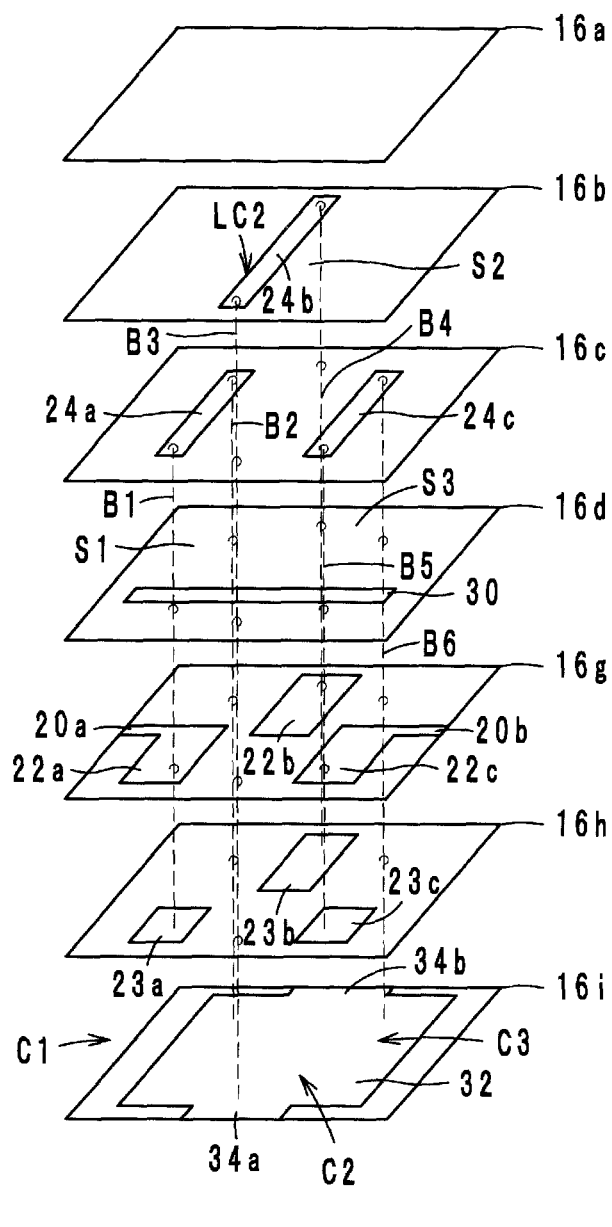
FIG. 5 is an exploded perspective view of a laminated body of an electronic component according to a first example of a modification of a preferred embodiment of the present invention.

Hereinafter, an electronic component 10a according to a first example of a modification of a preferred embodiment of the present invention will be described with reference to FIG. 5. FIG. 5 is the exploded perspective view of the laminated body 12a of the electronic component 10a according to the first example of a modification. In FIG. 5, the same reference symbols in the electronic component 10a are assigned to the same elements as in the electronic component 10. FIG. 1 is referred to for the perspective view of the electronic component 10a.

A difference between the electronic component 10 and the electronic component 10a is the position at which the capacitor C2 is provided. In more detail, as illustrated in FIG. 2, in the electronic component 10, the capacitor C2 is connected to the via hole conductor B3. On the other hand, in the electronic component 10a, the capacitor C2 is connected to the via hole conductor B4. Since the remaining configuration of the electronic component 10a is preferably the same or substantially the same as the electronic component 10, the description thereof will be omitted.

In the electronic component 10a configured as described above, in the same or substantially the same manner as the electronic component 10, it is possible to achieve band narrowing of a pass band and reduce the transmission loss of a high-frequency signal. In particular, according to the electronic component 10a, in the same or substantially the same manner as the electronic component 10, it is possible to achieve the reduction of an insertion loss in the low frequency domain of the pass band. In addition, according to the electronic component 10a, in the same or substantially the same manner as the electronic component 10, fluctuations of a transmission characteristic due to a production tolerance are minimized or prevented.

Figure 6:
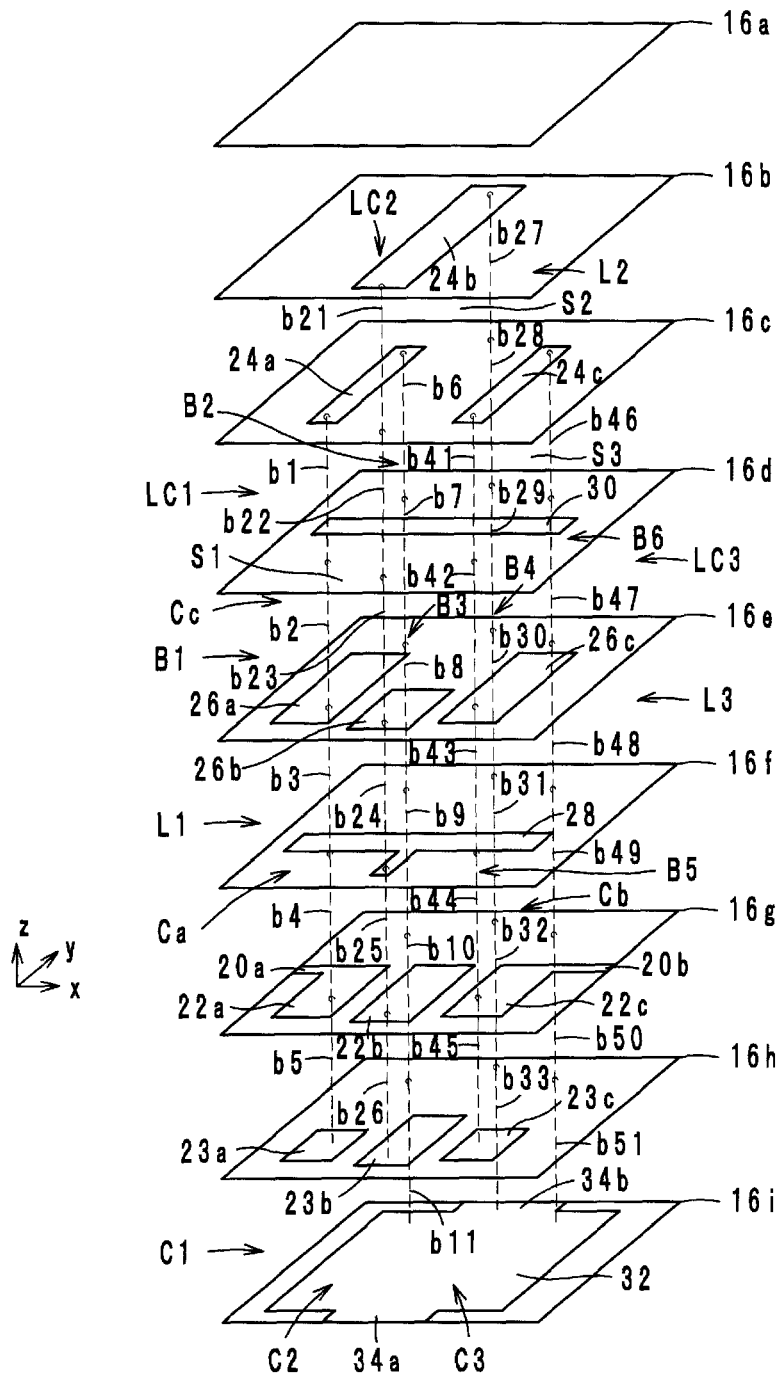
FIG. 6 is an exploded perspective view of a laminated body of an electronic component according to a second example of a modification of a preferred embodiment of the present invention.

Hereinafter, an electronic component 10b according to a second example of a modification of a preferred embodiment of the present invention will be described with reference to FIG. 6. FIG. 6 is the exploded perspective view of the laminated body 12b of the electronic component 10b according to the second example of a modification. In FIG. 6, the same reference symbols in the electronic component 10b are assigned to the same elements as in the electronic component 10. FIG. 1 is referred to for the perspective view of the electronic component 10b.

A difference between the electronic component 10 and the electronic component 10b is the line width of the coil conductor layer 24b. In more detail, in the electronic component 10, the line widths of the coil conductor layer 24a to 24c are equal to one another. On the other hand, in the electronic component 10b, the line width of the coil conductor layer 24b is preferably larger than the line widths of the coil conductor layers 24a and 24c. Accordingly, the direct-current resistance value of the LC parallel resonator LC2 is reduced, and the Q value of the LC parallel resonator LC2 is large. As a result, in the electronic component 10b, it is possible to further reduce the insertion loss of a high-frequency signal in a pass band. In particular, in the electronic component 10b, the reduction of an insertion loss in the low frequency domain of the pass band is further achieved.

Figure 7:
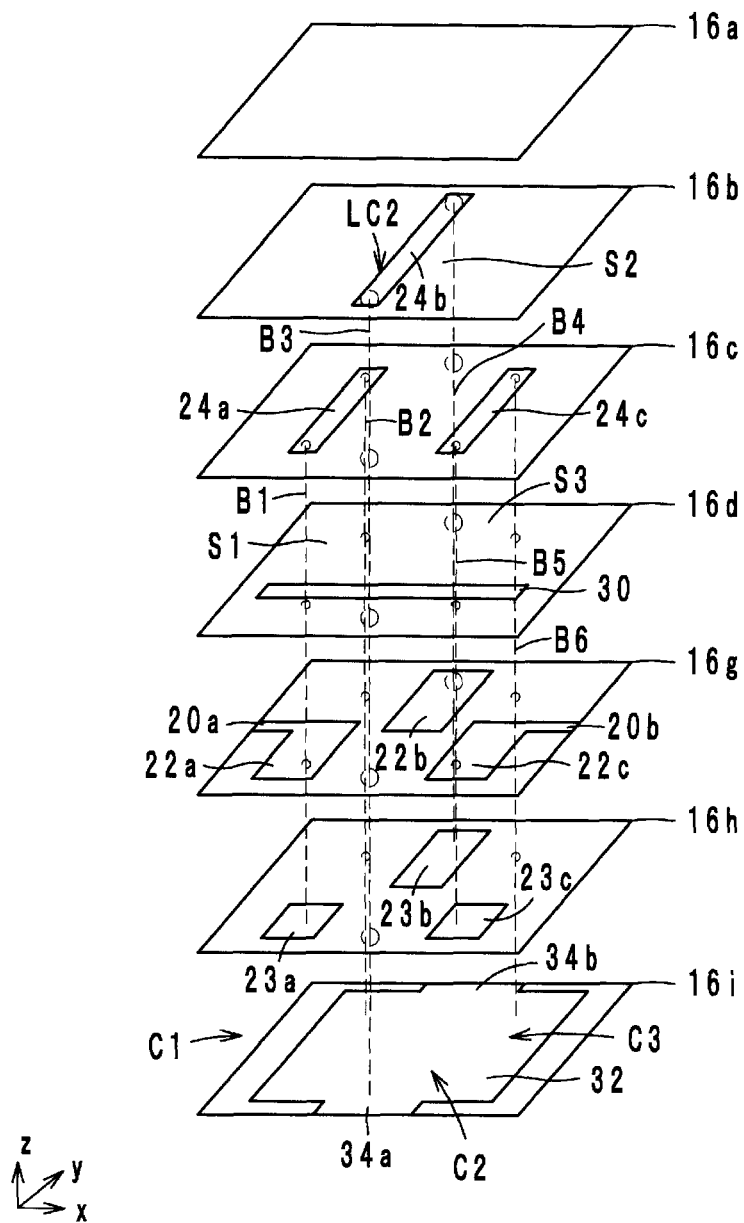
FIG. 7 is an exploded perspective view of a laminated body of an electronic component according to a third example of a modification of a preferred embodiment of the present invention.

Hereinafter, an electronic component 10c according to a third example of a modification of a preferred embodiment of the present application will be described with reference to a drawing. FIG. 7 is the exploded perspective view of the laminated body 12c of the electronic component 10c according to the third example of a modification. In FIG. 7, the same reference symbols in the electronic component 10c are assigned to the same elements as in the electronic component 10. FIG. 1 is referred to for the perspective view of the electronic component 10c.

A difference between the electronic component 10a and the electronic component 10c is the diameters of the via hole conductors B3 and B4. In more detail, in the electronic component 10a, the diameters of the via hole conductor B1 to B6 are equal or substantially equal to one another. On the other hand, in the electronic component 10c, the diameters of the via hole conductors B3 and B4 are preferably greater than the diameters of the via hole conductors B1, B2, B5, and B6. Accordingly, the direct-current resistance value of the LC parallel resonator LC2 is reduced, and the Q value of the LC parallel resonator LC2 is large. As a result, in the electronic component 10c, it is possible to further reduce the insertion loss of a high-frequency signal in a pass band. In particular, in the electronic component 10c, the reduction of an insertion loss in the low frequency domain of the pass band is further achieved.

Figure 8A:
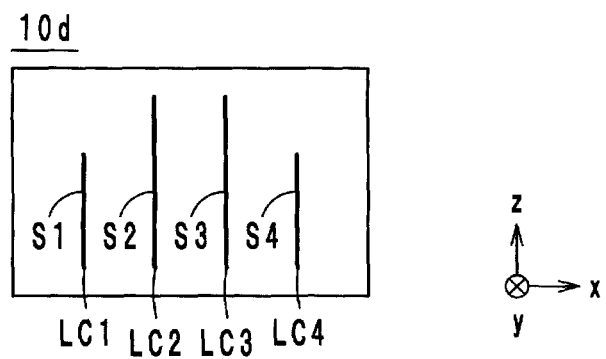
FIG. 8A and FIG. 8B are cross-sectional views of an electronic component according to a fourth example of a modification of a preferred embodiment of the present invention and an electronic component according to a fifth example of a modification of a preferred embodiment of the present invention, respectively.
Figure 8B:
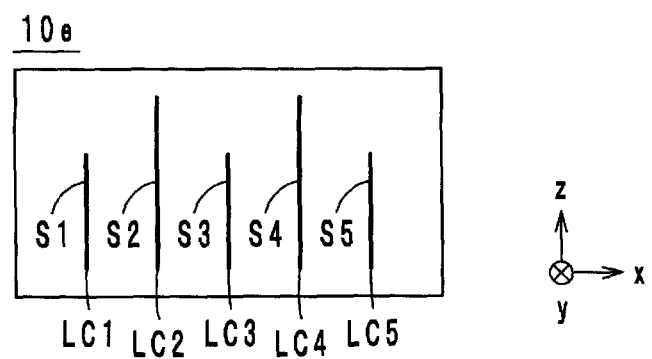
Figure 9:
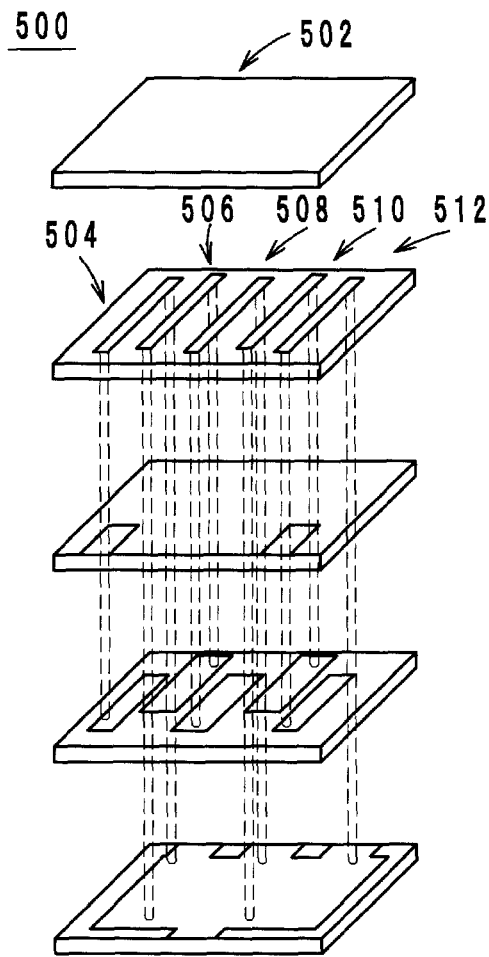
FIG. 9 is an exploded perspective view of a laminated band pass filter described in International Publication No. WO 2007/119356.

Each of the electronic components 10 and 10a to 10c preferably includes the LC parallel resonators LC1 to LC3. However, the number of LC parallel resonators embedded in each of the electronic components 10 and 10a to 10c is not limited to this. FIG. 8A and FIG. 8B are the cross-sectional structure diagrams of an electronic component 10d according to a fourth example of a modification of a preferred embodiment of the present invention and an electronic component 10e according to a fifth example of a modification of a preferred embodiment of the present invention, respectively.

The electronic component 10d includes LC parallel resonators LC1 to LC4. In the electronic component 10d, in planar view in the x-axis direction, the loop surfaces S1 and S4 of the LC parallel resonators LC1 and LC4 are disposed within the loop surfaces S2 and S3 of the LC parallel resonators LC2 and LC3. In the electronic component 10d, the loop surfaces S2 and S3 of the second-stage LC parallel resonator LC2 and the third-stage LC parallel resonator LC3 are increased in size, and thus, in the same or substantially the same manner as the electronic component 10, the reduction of an insertion loss in the low frequency domain of a pass band is achieved. In addition, one of the loop surfaces S2 and S3 of the second-stage LC parallel resonator LC2 and the third-stage LC parallel resonator LC3 may also be increased in size. When the loop surface S2 is increased in size, the loop surface S4 may also be increased in size. When the loop surface S3 is increased in size, the loop surface S1 may also be increased in size.

The electronic component 10e includes LC parallel resonators LC1 to LC5. In the electronic component 10e, in planar view in the x-axis direction, the loop surfaces S1, S3, and S5 of the LC parallel resonators LC1, LC3, and LC5 are disposed within the loop surfaces S2 and S4 of the LC parallel resonators LC2 and LC4. In the electronic component 10e, the loop surfaces S2 and S4 of the second-stage LC parallel resonator LC2 and the fourth-stage LC parallel resonator LC4 are increased in size, and thus, in the same or substantially the same manner as the electronic component 10, the reduction of an insertion loss in the low frequency domain of a pass band is achieved. In addition, one of the loop surfaces S2 and S4 of the second-stage LC parallel resonator LC2 and the fourth-stage LC parallel resonator LC4 may also be increased in size. When the loop surface S2 is increased in size, the loop surface S5 may also be increased in size. When the loop surface S4 is increased in size, the loop surface S1 may also be increased in size.

In addition, the electronic component 10 is not limited to the electronic components 10 and 10a to 10e illustrated in the above-described preferred embodiments, and alterations may be made within the scope of the present invention.

In addition, the number of LC parallel resonators may also be two, for example.

In addition, the configurations of the electronic components 10 and 10a to 10e may be combined.

Preferred embodiments of the present invention are useful for an electronic component, and in particular, superior in terms of being capable of achieving band narrowing of a pass band and reducing the transmission loss of a high-frequency signal in a pass band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An electronic component comprising:
a laminated body including a plurality of insulator layers that are laminated to one another;
a first LC parallel resonator and a second LC parallel resonator each being loop-shaped or substantially loop-shaped and including via hole conductors extending in a lamination direction and conductor layers respectively provided on the plurality of insulator layers, the first and second LC parallel resonators defining a band pass filter;
a third LC parallel resonator that is loop-shaped or substantially loop-shaped and includes via hole conductors extending in the lamination direction and a conductor layer provided on one of the plurality of insulator layers, the third LC parallel resonator defining the band pass filter in combination with the first LC parallel resonator and the second LC parallel resonator; and
a capacitor; wherein
a first loop surface surrounded by the first LC parallel resonator in a planar view in a direction perpendicular or substantially perpendicular to the first loop surface is parallel or substantially parallel to a second loop surface surrounded by the second LC parallel resonator in a planar view in a direction perpendicular or substantially perpendicular to the second loop surface;
the first loop surface is disposed within the second loop surface in the planar view in the direction perpendicular or substantially perpendicular to the second loop surface;
the first LC parallel resonator, the second LC parallel resonator, and the third LC parallel resonator are arranged in this order in the planar view in the lamination direction;
the first LC parallel resonator includes a first capacitor conductor layer;
the third LC parallel resonator includes a third capacitor conductor layer; and
the capacitor is defined by:
  the first capacitor conductor layer;
  the third capacitor conductor layer; and
  a coupling conductor layer facing the first capacitor conductor layer and the third capacitor conductor layer.

2. The electronic component according to claim 1, wherein the second LC parallel resonator includes a second capacitor conductor layer that does not face the coupling conductor layer.

3. The electronic component according to claim 1, wherein a third loop surface surrounded by the third LC parallel resonator in a planar view in a direction perpendicular or substantially perpendicular to the third loop surface is parallel or substantially parallel to the second loop surface; and
the third loop surface is disposed within the second loop surface in the planar view in the direction perpendicular or substantially perpendicular to the second loop surface.

4. The electronic component according to claim 3, wherein the conductor layers of the first LC parallel resonator include a first conductor layer that is linear or substantially linear, and the via hole conductors of the first LC parallel resonator include a first via hole conductor and a second via hole conductor, which extend from respective end portions of the first conductor layer toward a lower side of the laminated body in the lamination direction;
the conductor layers of the second LC parallel resonator include a second conductor layer that is linear or substantially linear, and the via hole conductors of the second LC parallel resonator include a third via hole conductor and a fourth via hole conductor, which extend from respective end portions of the second conductor layer toward the lower side of the laminated body in the lamination direction; and
the conductor layer of the third LC parallel resonator is linear of substantially linear, and the via hole conductors of the third LC parallel resonator include a fifth via hole conductor and a sixth via hole conductor, which extend from respective end portions of the conductor layer of the third LC parallel resonator toward the lower side of the laminated body in the lamination direction.

5. The electronic component according to claim 4, wherein a length of the first conductor layer is the same or substantially the same as a length of the third conductor layer.

6. The electronic component according to claim 4, wherein a length of the first via hole conductor is the same or substantially the same as a length of the fifth via hole conductor.

7. The electronic component according to claim 4, wherein a length of the second via hole conductor is the same or substantially the same as a length of the sixth via hole conductor.

8. The electronic component according to claim 4, wherein a line width of the first conductor layer is the same or substantially the same as a line width of the third conductor layer.

9. The electronic component according to claim 1, wherein
the conductor layers of the first LC parallel resonator include a first conductor layer that is linear or substantially linear, and the via hole conductors of the first LC parallel resonator include a first via hole conductor and a second via hole conductor, which extend from respective end portions of the first conductor layer toward a lower side of the laminated body in the lamination direction; and
the conductor layers of the second LC parallel resonator include a second conductor layer that is substantially linear, and the via hole conductors of the second LC parallel resonator include a third via hole conductor and a fourth via hole conductor, which extend from respective end portions of the second conductor layer toward the lower side of the laminated body in the lamination direction.

10. The electronic component according to claim 9, wherein the second conductor layer is provided on an upper side of the laminated body in the lamination direction, as compared to the first conductor layer.

11. The electronic component according to claim 9, wherein a distance between the third via hole conductor and the fourth via hole conductor is greater than a distance between the first via hole conductor and the second via hole conductor.

12. The electronic component according to claim 9, wherein a line width of the second conductor layer is greater than a line width of the first conductor layer.

13. The electronic component according to claim 9, wherein
a diameter of the third via hole conductor and a diameter of the fourth via hole conductor are greater than a diameter of the first via hole conductor and a diameter of the second via hole conductor.

14. The electronic component according to claim 9, wherein a length of the third via hole conductor and a length of the fourth via hole conductor are greater than a length of the first via hole conductor and a length of the second via hole conductor.

15. The electronic component according to claim 9, wherein a length of the second conductor layer is greater than a length of the first conductor layer.

16. The electronic component according to claim 1, wherein the plurality of insulator layers are made of a ceramic dielectric material.

17. The electronic component according to claim 1, further comprising a plurality of outer electrodes provided on side surfaces of the laminated body and connected to at least one of the first and second LC parallel resonators.

18. The electronic component according to claim 1, wherein each of the first loop surface and the second loop surface have a rectangular or substantially rectangular shape.

19. An electronic component comprising:
a laminated body including a plurality of insulator layers that are laminated to one another;
a first LC parallel resonator and a second LC parallel resonator each being loop-shaped or substantially loop-shaped and including via hole conductors extending in a lamination direction and conductor layers respectively provided on the plurality of insulator layers, the first and second LC parallel resonators defining a band pass filter; and
a third LC parallel resonator that is loop-shaped or substantially loop-shaped and includes via hole conductors extending in the lamination direction and a conductor layer provided on one of the plurality of insulator layers, the third LC parallel resonator defining the band pass filter in combination with the first LC parallel resonator and the second LC parallel resonator; wherein
a first loop surface surrounded by the first LC parallel resonator in a planar view in a direction perpendicular or substantially perpendicular to the first loop surface is parallel or substantially parallel to a second loop surface surrounded by the second LC parallel resonator in a planar view in a direction perpendicular or substantially perpendicular to the second loop surface;
the first loop surface is disposed within the second loop surface in the planar view in the direction perpendicular or substantially perpendicular to the second loop surface;
the first LC parallel resonator, the second LC parallel resonator, and the third LC parallel resonator are arranged in this order in the planar view in the lamination direction;
a third loop surface surrounded by the third LC parallel resonator in a planar view in a direction perpendicular or substantially perpendicular to the third loop surface is parallel or substantially parallel to the second loop surface;

the third loop surface is disposed within the second loop surface in the planar view in the direction perpendicular or substantially perpendicular to the second loop surface;
the conductor layers of the first LC parallel resonator include a first conductor layer that is linear or substantially linear, and the via hole conductors of the first LC parallel resonator include a first via hole conductor and a second via hole conductor, which extend from respective end portions of the first conductor layer toward a lower side of the laminated body in the lamination direction;
the conductor layers of the second LC parallel resonator include a second conductor layer that is linear or substantially linear, and the via hole conductors of the second LC parallel resonator include a third via hole conductor and a fourth via hole conductor, which extend from respective end portions of the second conductor layer toward the lower side of the laminated body in the lamination direction;
the conductor layer of the third LC parallel resonator is linear of substantially linear, and the via hole conductors of the third LC parallel resonator include a fifth via hole conductor and a sixth via hole conductor, which extend from respective end portions of the conductor layer of the third LC parallel resonator toward the lower side of the laminated body in the lamination direction; and
a length of the first conductor layer is the same or substantially the same as a length of the third conductor layer.

20. The electronic component according to claim 19, further comprising:
a capacitor; wherein
the first LC parallel resonator includes a first capacitor conductor layer;
the third LC parallel resonator includes a third capacitor conductor layer; and
the capacitor is defined by:
the first capacitor conductor layer;
the third capacitor conductor layer; and
a coupling conductor layer facing the first capacitor conductor layer and the third capacitor conductor layer.

* * * * *